US008298849B2

(12) United States Patent
Ding et al.

(10) Patent No.: US 8,298,849 B2
(45) Date of Patent: Oct. 30, 2012

(54) NITROGEN REACTIVE SPUTTERING OF CU-IN-GA-N FOR SOLAR CELLS

(75) Inventors: Guowen Ding, San Jose, CA (US); Hien Minh Huu Le, San Jose, CA (US); Guizhen Zhang, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/269,713

(22) Filed: Oct. 10, 2011

(65) Prior Publication Data

US 2012/0196399 A1 Aug. 2, 2012

Related U.S. Application Data

(60) Provisional application No. 61/438,216, filed on Jan. 31, 2011.

(51) Int. Cl.
*H01L 21/00* (2006.01)

(52) U.S. Cl. .......... 438/57; 136/244; 136/252; 136/262; 136/265; 257/E21.068; 438/93; 438/95

(58) Field of Classification Search .................. 136/244, 136/252, 262, 265; 257/E21.068; 438/57, 438/93, 95
See application file for complete search history.

(56) References Cited

U.S. PATENT DOCUMENTS

2011/0049465 A1* 3/2011 Nagashima ............... 257/5
* cited by examiner

*Primary Examiner* — Asok Sarkar

(57) ABSTRACT

Methods for forming Cu—In—Ga—N (CIGN) layers for use in TFPV solar panels are described using reactive PVD deposition in a nitrogen containing atmosphere. In some embodiments, the CIGN layers can be used as an absorber layer and eliminate the need of a selenization step. In some embodiments, the CIGN layers can be used as a protective layer to decrease the sensitivity of the CIG layer to oxygen or moisture before the selenization step. In some embodiments, the CIGN layers can be used as an adhesion layer to improve the adhesion between the back contact layer and the absorber layer.

6 Claims, 15 Drawing Sheets

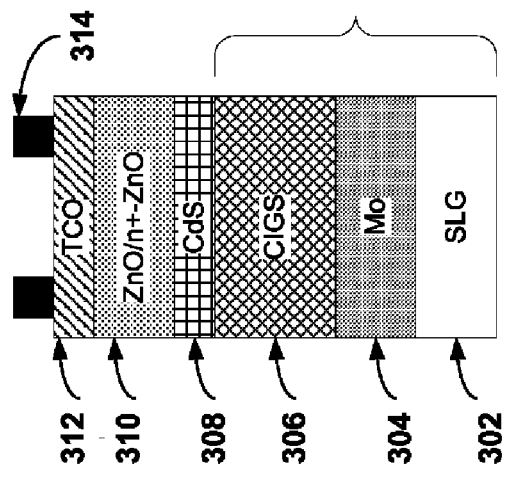
FIG. 3A
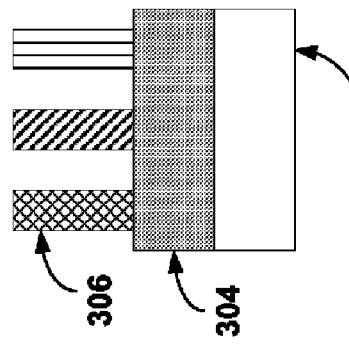
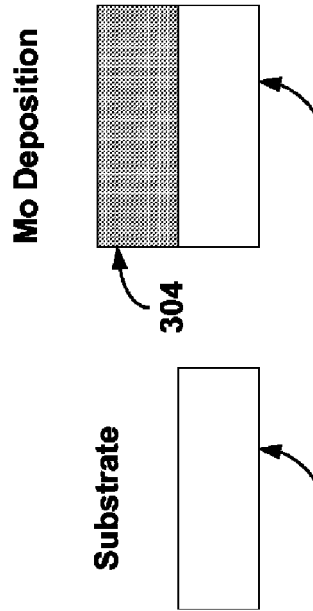
FIG. 3B

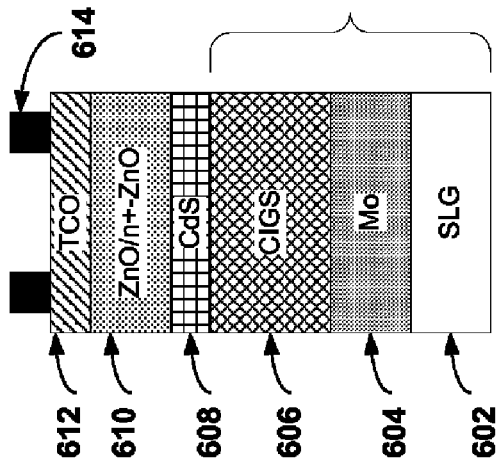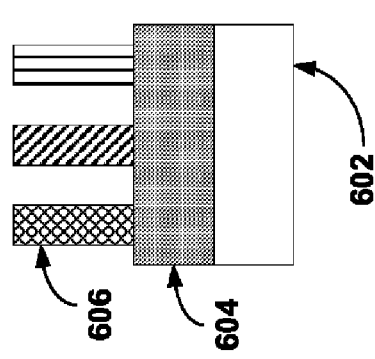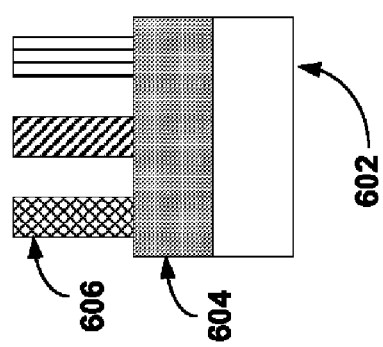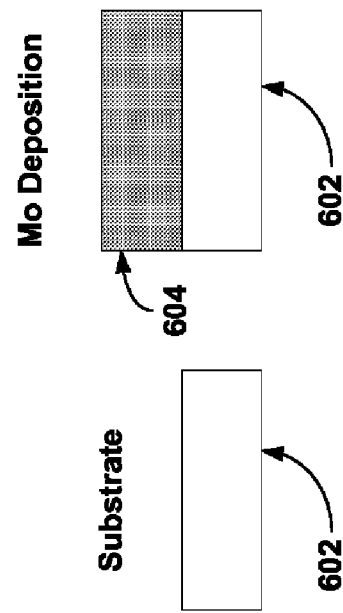
FIG. 6A
FIG. 6C
FIG. 6B

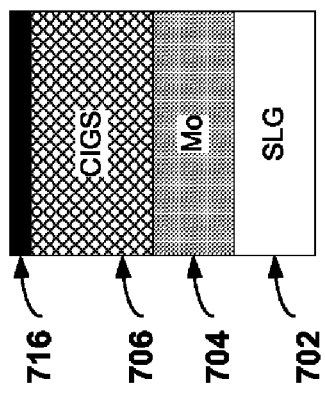
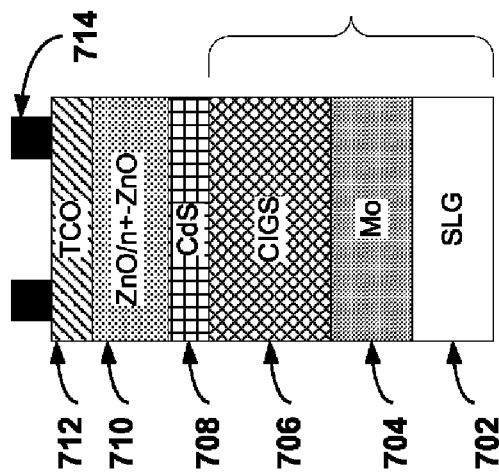
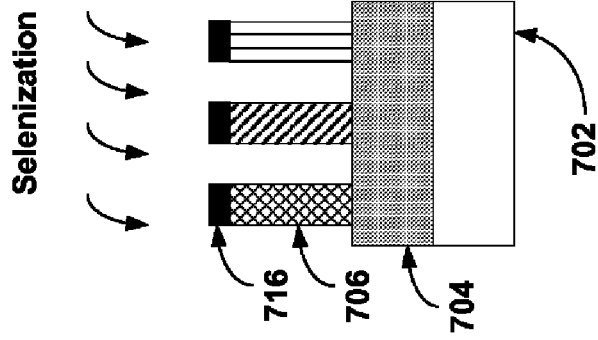
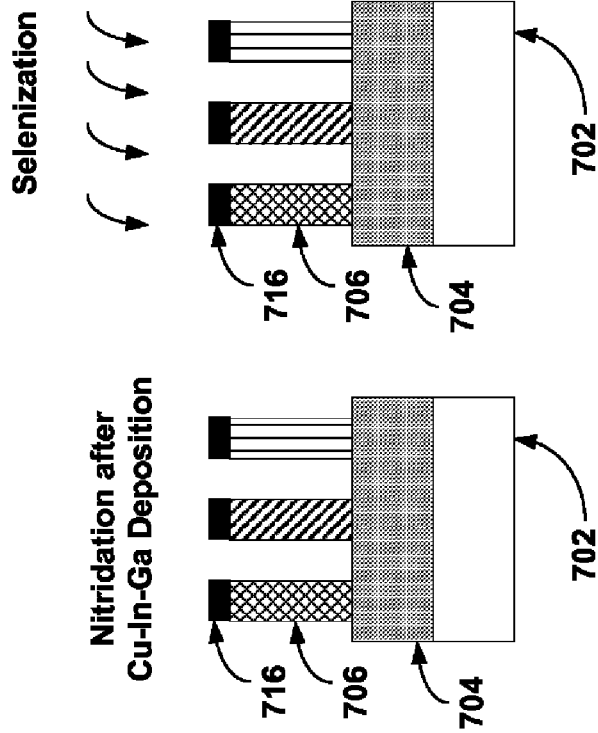
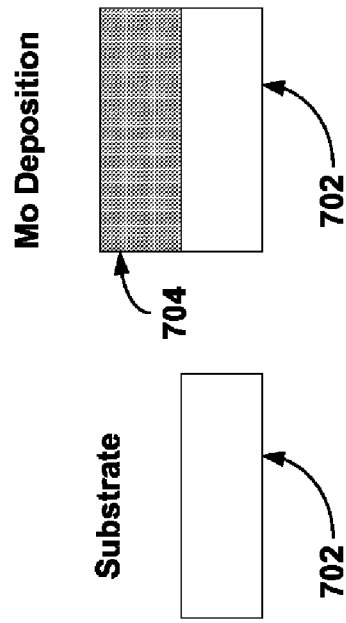

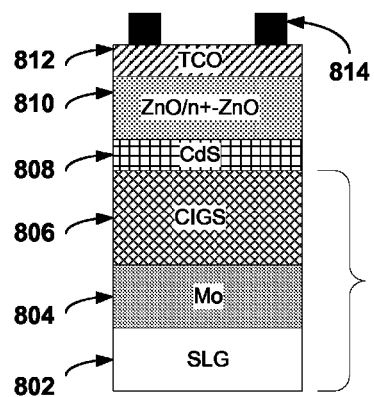
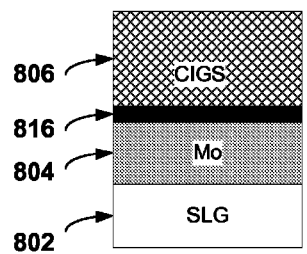
FIG. 8A
FIG. 8C
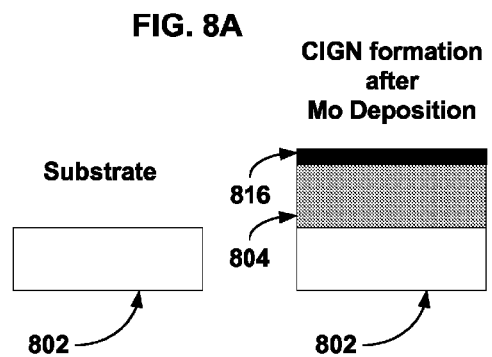
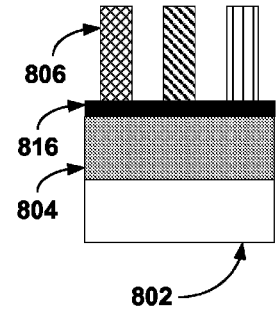
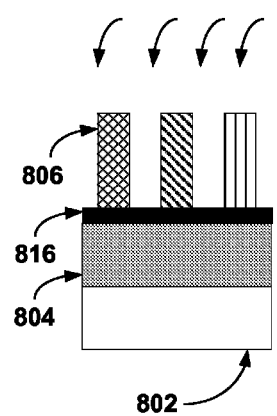
FIG. 8B

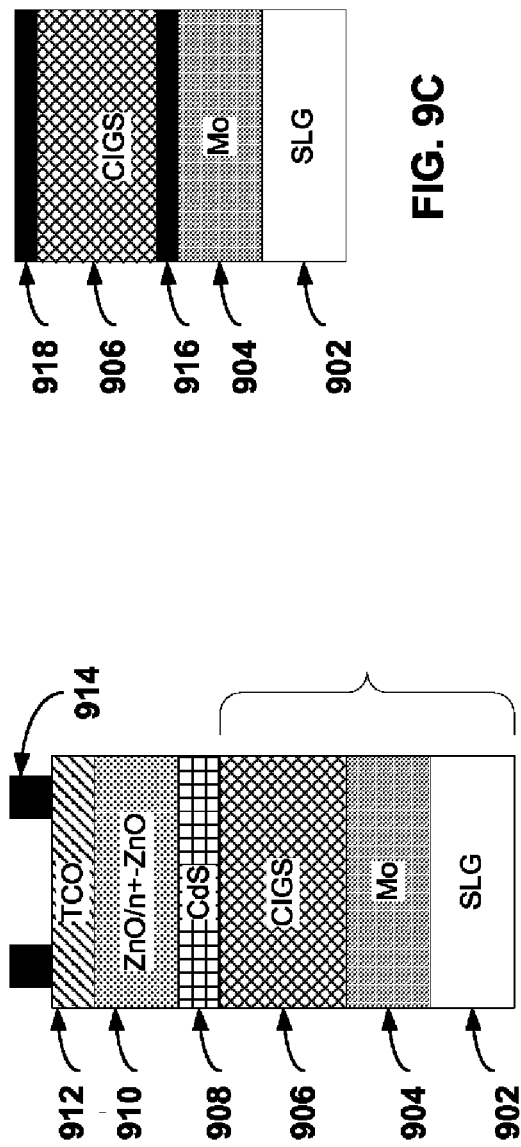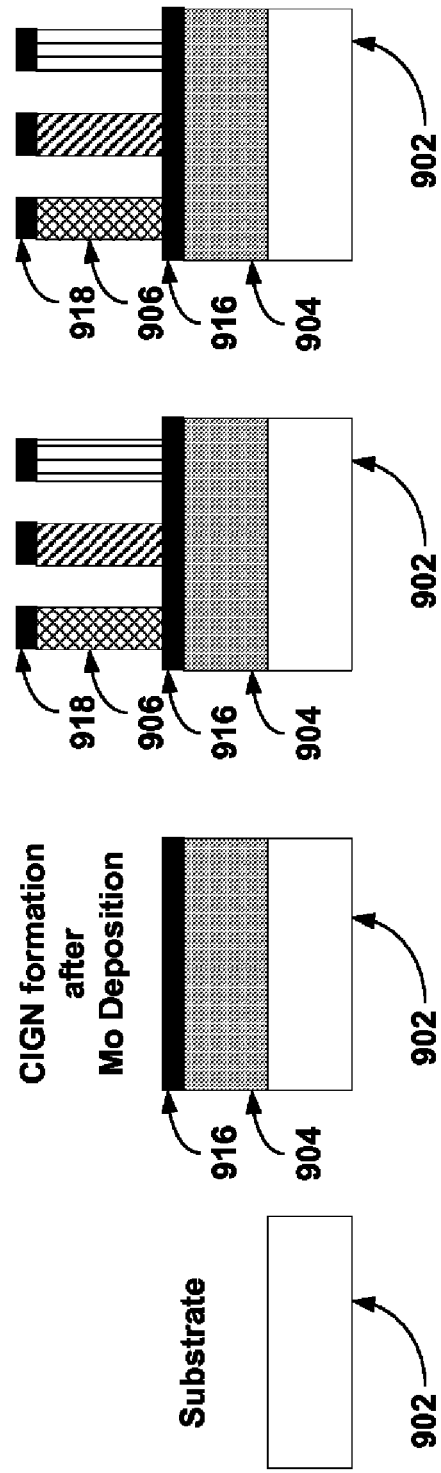
FIG. 9A
FIG. 9B
FIG. 9C

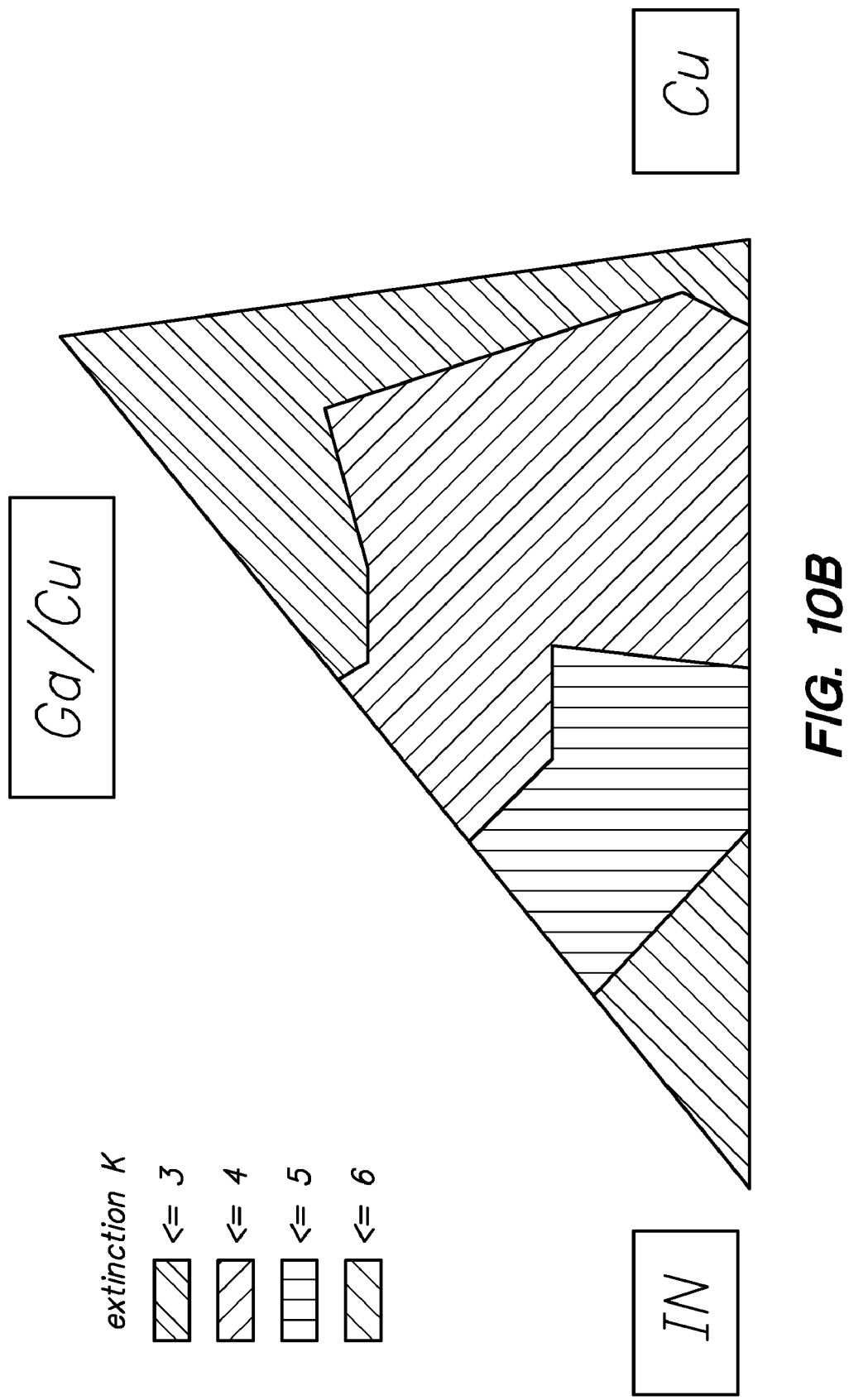

NITROGEN REACTIVE SPUTTERING OF CU-IN-GA-N FOR SOLAR CELLS

CROSS-REFERENCE TO RELATED APPLICATIONS

This application claims priority to U.S. Provisional Patent Application Ser. No. 61/438,216 entitled "Nitrogen Reaction Sputtering Copper-Indium-Gallium for Solar Cells" and filed Jan. 31, 2011, which is herein incorporated by reference

FIELD OF THE INVENTION

The present invention relates in general to solar cells, and more particularly to copper-indium-gallium-nitride (CIGN) solar cells and a method for manufacturing CIGN solar cells.

BACKGROUND OF THE INVENTION

Solar cells have been developed as clean, renewable energy sources to meet growing demand. Currently, crystalline silicon solar cells (both single crystal and polycrystalline) are the dominant technologies in the market. Crystalline silicon solar cells must use a thick substrate (>100 um) of silicon to absorb the sunlight since it has an indirect band gap. Also, the absorption coefficient is low for crystalline silicon because of the indirect band gap. The use of a thick substrate also means that the crystalline silicon solar cells must use high quality material to provide long carrier lifetimes to allow the carriers to diffuse to the contacts. Therefore, crystalline silicon solar cell technologies lead to increased costs. Thin film solar cells based on amorphous silicon (a-Si), copper indium gallium (sulfide) selenide (CIGS), cadmium telluride (CdTe), and copper zinc tin (sulfide) selenide (CZTS), etc. provide an opportunity to increase the material utilization since only thin films (<10 um) are generally required. CdTe and CZTS films have band gaps of about 1.5 eV and therefore, are efficient absorbers for wavelengths shorter than about 800 nm. The absorption coefficient for CdTe is about $10^5$/cm and the absorption coefficient for CZTS is about $10^4$/cm. CIGS films have bandgaps in the range of 1.0 eV (CIS) to 1.65 eV (CGS) and are also efficient absorbers across the entire visible spectrum. The absorption coefficient for CIGS is about $10^5$/cm. Additionally, thin film solar cells can be fabricated at the module level, thus further decreasing the manufacturing costs. Furthermore, thin film solar cells may be fabricated on inexpensive substrates such as glass, plastics, and thin sheets of metal. Among the thin film solar cells, CIGS has demonstrated the best lab cell efficiency (close to 20%) and the best large area module efficiency (>12%).

The increasing demand for environmentally friendly, sustainable and renewable energy sources is driving the development of large area, thin film photovoltaic (TFPV) devices. With a long-term goal of providing a significant percentage of global energy demand, there is a concomitant need for Earth-abundant, high conversion efficiency materials for use in photovoltaic devices. A number of Earth abundant direct-bandgap semiconductor materials now seem to show evidence of the potential for both high efficiency and low cost in Very Large Scale (VLS) production (e.g. greater than 100 gigawatt (GW)), yet relatively little attention has been devoted to their development and characterization.

Among the TFPV technologies, CIGS and CdTe are the two that have reached volume production with greater than 10% stabilized module efficiencies. Solar cell production volume must increase tremendously in the coming decades to meet sharply growing energy needs. However, the supply of In, Ga and Te may impact annual production of CIGS and CdTe solar panels. Moreover, price increases and supply constraints in In and Ga could result from the aggregate demand for these materials used in flat panel displays (FPD) and light-emitting diodes (LED) along with CIGS TFPV. Also, there are concerns about the toxicity of Cd throughout the lifecycle of the CdTe TFPV solar modules. Efforts to develop devices that leverage manufacturing and R&D infrastructure related to TFPV using more widely available and more environmentally friendly raw materials should be considered a top priority for research.

The immaturity of TFPV devices exploiting Earth abundant materials represents a daunting challenge in terms of the time-to-commercialization. That same immaturity also suggests an enticing opportunity for breakthrough discoveries. A quaternary system such as CIGS or CZTS requires management of multiple kinetic pathways, thermodynamic phase equilibrium considerations, defect chemistries, and interfacial control. The vast phase-space to be managed includes process parameters, source material choices, compositions, and overall integration schemes. Traditional R&D methods are ill-equipped to address such complexity, and the traditionally slow pace of R&D could limit any new material from reaching industrial relevance when having to compete with the incrementally improving performance of already established TFPV fabrication lines.

However, due to the complexity of the material, cell structure and manufacturing process, both the fundamental scientific understanding and large scale manufacturability are yet to be improved for CIGS and CZTS solar cells. As the photovoltaic industry pushes to achieve grid parity, much faster and broader investigation is needed to explore the material, device, and process windows for higher efficiency and a lower cost of manufacturing process. Efficient methods for forming different types of CIGS and CZTS solar cells that can be evaluated are necessary.

The efficiency of TFPV solar cells depends on many properties of the absorber layer and the buffer layer such as crystallinity, grain size, composition uniformity, density, defect concentration, doping level, surface roughness, etc.

The manufacture of TFPV modules entails the integration and sequencing of many unit processing steps. As an example, TFPV manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. application Ser. No. 11/352,077 filed on Feb. 10, 2006, claiming priority from Oct. 15, 2005, U.S. application Ser. No. 11/419,174 filed on May 18, 2006, claiming priority from Oct. 15, 2005, U.S. application Ser. No. 11/674,132 filed on Feb. 12, 2007, claiming priority from Oct. 15, 2005, and U.S. application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

The manufacturing of solar cells, such as CIGS solar cells, often involves the use of toxic materials, such as those used in selenization processes. The handling and removal of the materials related to selenization processes significantly affects the manufacturing costs of such solar cells. Additionally, the use of selenization typically results in the cells being sensitive to exposure to the atmosphere, which is often the case between various manufacturing steps (i.e., "queue time"). Further, there is a need to improve the adhesion between the CIGS layers and the molybdenum back contact layer.

SUMMARY OF THE DISCLOSURE

In some embodiments of the present invention, reactive sputtering is used to form Cu—In—Ga—N (CIGN) materials to be used as the absorber layer in thin film solar panels. This material can be used with or without a selenization process typically used to form CIGS materials. In some embodiments, a nitridation process is implemented before the formation of CIGN or CIGS materials. In some embodiments, a nitridation process is implemented after the formation of CIGN or CIGS materials. In some embodiments, a nitridation process is implemented during the formation of CIGN or CIGS materials.

In some embodiments, a nitrogen reactive sputtering process is used in place of a selenization process. One advantage of such a method is that the nitrogen reactive sputtering process may be less toxic than the selenization process, while still allowing a band gap of between 0.7 electron-volts (eV) and 1.7 eV, which is suitable for solar cells.

In some embodiments, a Cu—In—Ga—N protective nitride layer is formed over CIG layers (i.e., after the formation of the CIG layers) before the CIG layers are exposed to the atmosphere. One advantage of such embodiments is that the nitride layer may protect the CIG layers from oxygen and water vapor, which may reduce any adverse effects from such exposure during "queue" time (i.e., before subsequent processing steps).

In some embodiments, a nitridation process is performed before the formation of the CIG layers on a Mo back contact layer. One advantage of such embodiments is that the adhesion between the CIG layers and the Mo layer may be improved.

A further advantage of some embodiments described herein is that manufacturing costs may be reduced, as the removal of the selenization may eliminate some of the costs incurred to remove toxic materials used in solar cell processing. Additionally, product quality may be improved.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 3A and 3B illustrate schematic diagrams of a simple CIGS TFPV stack according to some embodiments described herein.

FIGS. 6A-6C illustrate schematic diagrams of a simple TFPV stack according to some embodiments described herein.

FIGS. 7A-7C illustrate schematic diagrams of a simple TFPV stack according to some embodiments described herein.

FIGS. 8A-8C illustrate schematic diagrams of a simple TFPV stack according to some embodiments described herein.

FIGS. 9A-9C illustrate schematic diagrams of a simple TFPV stack according to some embodiments described herein.

FIGS. 10A-10B present data for the refractive index, n, and extinction coefficient, k, for Cu—In—Ga films at 633 nm.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

As used herein, "CIGS" will be understood to represent the entire range of related alloys denoted by $Cu(In_xGa_{1-x})(S_ySe_{2-y})$ where $0 \leq x \leq 1$ and $0 \leq y \leq 2$. As used herein, "CZTS" will be understood to represent the entire range of related alloys denoted by $Cu_2ZnSn(S_ySe_{1-y})_4$ where $0 \leq y \leq 1$.

In FIGS. 3 and 6-9 below, a TFPV material stack is illustrated using a simple planar structure. Those skilled in the art will appreciate that the description and teachings to follow can be readily applied to any simple or complex TFPV solar cell morphology. The drawings are for illustrative purposes only and do not limit the application of the present invention.

Figure 1:
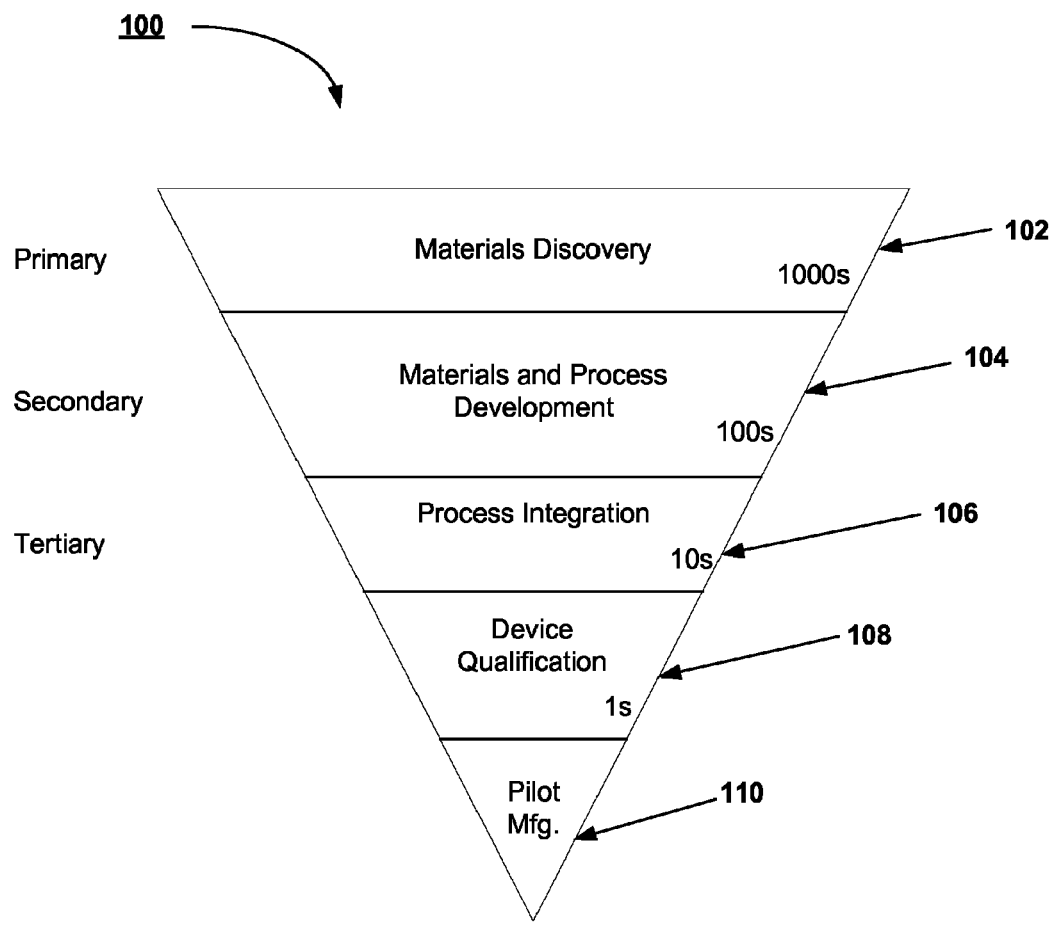
FIG. 1 is a schematic diagram for implementing combinatorial processing and evaluation.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of TFPV manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a TFPV device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a TFPV device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the TFPV device. For example, such structures may include, but would not be limited to, contact layers, buffer layers, absorber layers, or any other series of layers or unit processes that create an intermediate structure found on TFPV devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
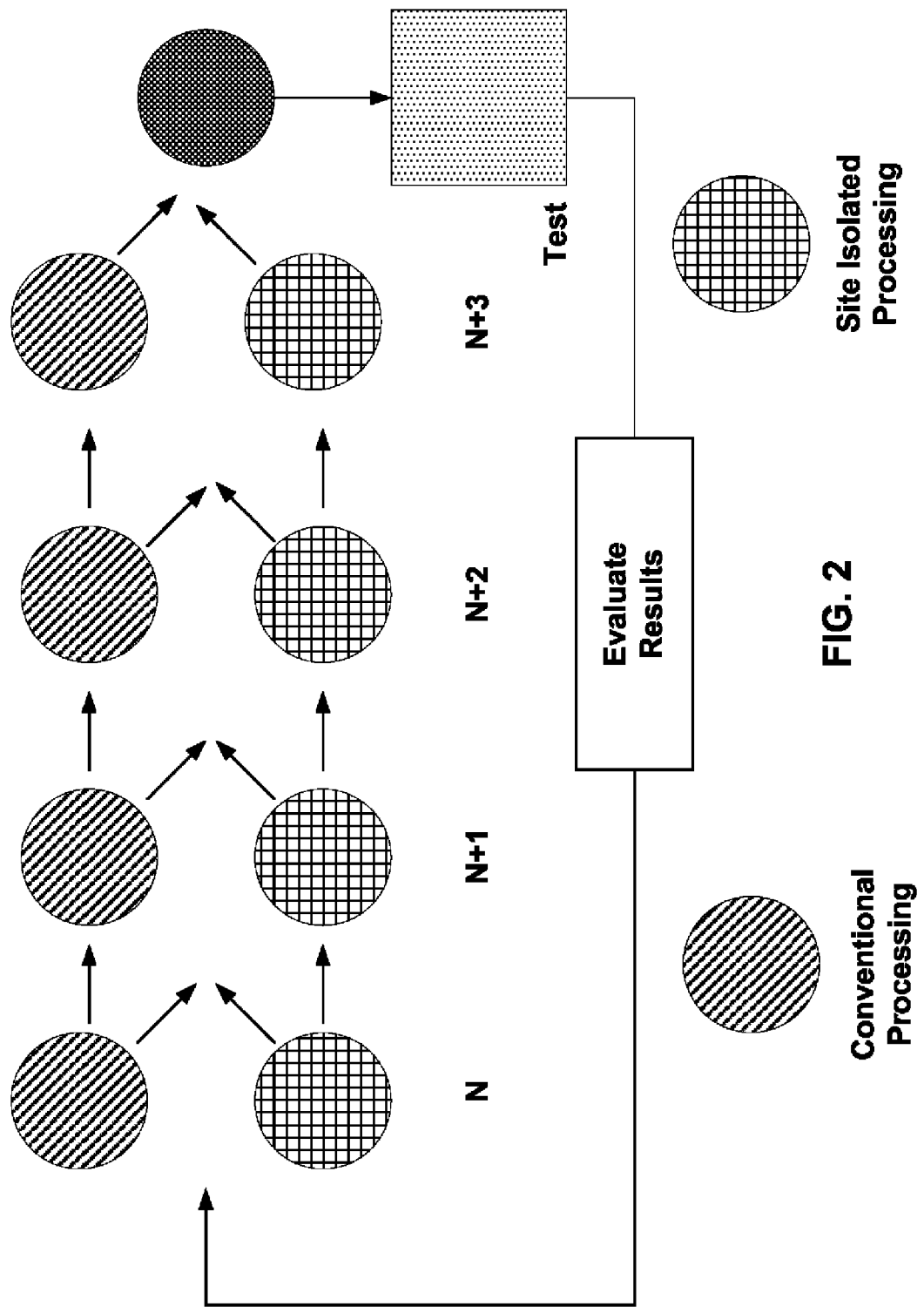
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in TFPV manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

FIGS. 3A and 3B illustrate a simple CIGS TFPV material stack consistent with some embodiments of the present invention. The convention will be used wherein light is assumed to be incident upon the top of the material stack. A back contact layer, 304, (typically Mo) is formed above a substrate, 302, (typically soda lime glass (SLG)). The back contact layer is typically between about 0.2 um and 1.0 um in thickness. The back contact layer is typically formed using a physical vapor deposition (PVD) process but may also be formed using an evaporation process. A CIGS absorber layer, 306, is formed above the back contact layer. The absorber layer is typically between about 0.5 um and 3.0 um in thickness. The absorber layer may be formed using a variety of techniques such as PVD, co-evaporation, printing or spraying of inks, CVD, etc. The different shading of the absorber layer, 306, in FIG. 3B is an indication that development activities on this layer can be accomplished using HPC techniques as will be discussed below. Advantageously, the absorber layer is deficient in Cu. The Cu deficiency may be controlled by managing the deposition conditions. Advantageously, a small amount of Na is contained in the absorber layer. The Na may be added by out-diffusion from the SLG substrate or may be purposely added in the form of $Na_2Se$ after the deposition of the absorber layer. Optionally, the absorber layer undergoes a selenization process after formation to fill the Se vacancies within the matrix. The selenization process involves the exposure of the absorber layer to $H_2Se$, Se vapor, or diethylselenide (DESe) at temperatures between about 400C and 600C as shown in FIG. 3B. During the selenization process, a layer of $MoSe_2$ forms at the back contact/absorber layer interface and forms a good ohmic contact between the two layers. A buffer layer, 308, (typically CdS) is then formed above the absorber layer. The buffer layer is typically between about 30 nm and 80 nm in thickness. The buffer layer is typically formed using a chemical bath deposition (CBD) technique or by PVD. Optionally, an intrinsic ZnO (iZnO) layer, 310, is then formed above the buffer layer. The iZnO layer is a high resistivity material and forms part of the transparent conductive oxide (TCO) stack that serves as part of the front contact structure. The TCO stack is formed from transparent conductive metal oxide materials and collects charge across the face of the TFPV solar cell and conducts the charge to the opaque metal grids used to connect the solar cell to external loads. The iZnO layer makes the TFPV solar cell less sensitive to lateral non-uniformities caused by differences in composition or defect concentration in the absorber and/or buffer layers.

The iZnO layer is typically between about 30 nm and 80 nm in thickness. The iZnO layer is typically formed using a reactive PVD technique or CVD technique. A low resistivity top TCO layer, 312, (examples include Al:ZnO (AZO), InSnO (ITO), InZnO, B:ZnO, Ga:ZnO, F:ZnO, F:SnO$_2$, etc.) is formed above the iZnO layer. The top TCO layer is typically between about 0.3 um and 2.0 um in thickness. The top TCO layer is typically formed using a reactive PVD technique or CVD technique. An opaque metal grid, 314, (typically Al or Ni:Al) is formed on top to collect the current and make connections to the balance of the system. The metal grid is typically between about 0.5 um and 2.0 um in thickness.

Figure 4:
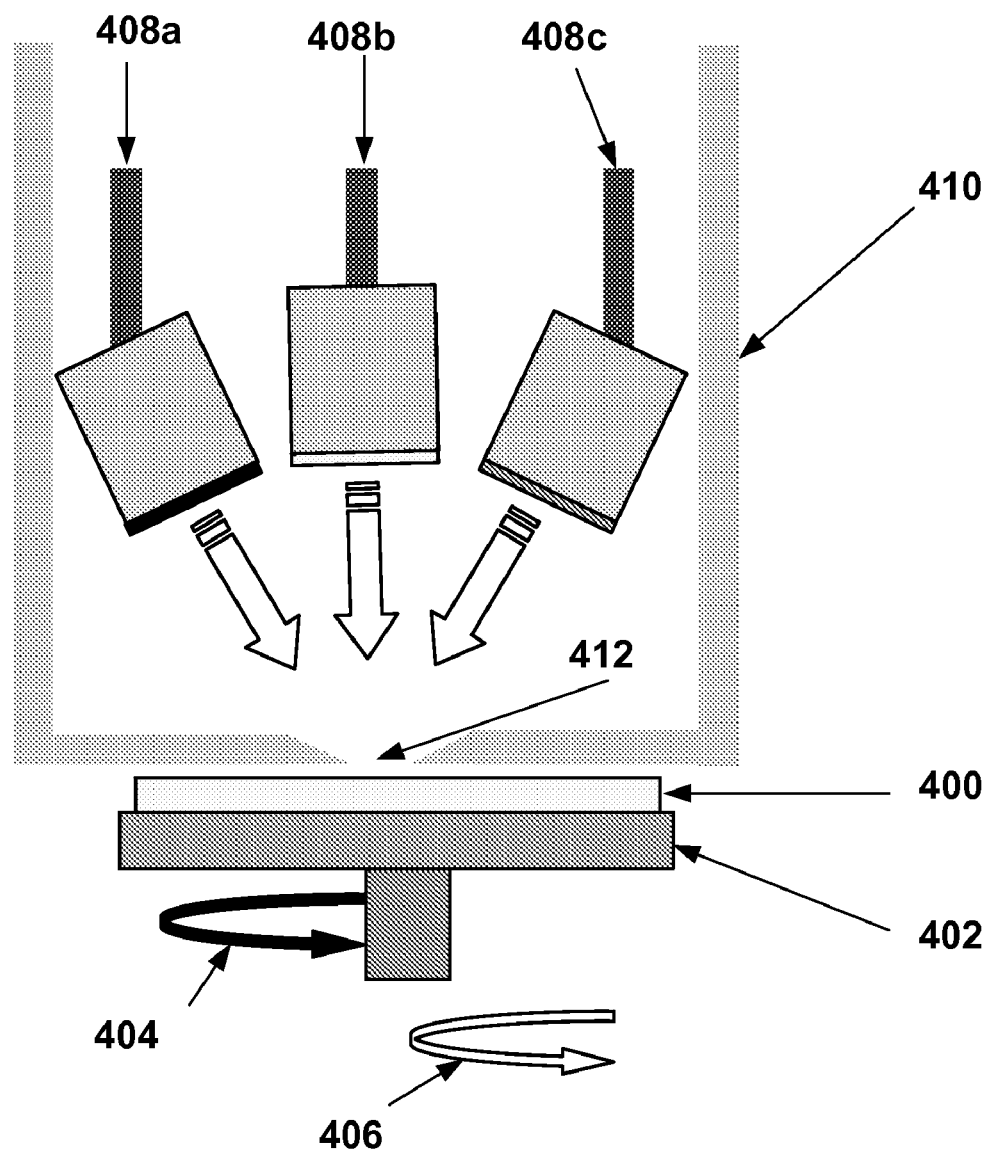
FIG. 4 illustrates a schematic diagram of a combinatorial PVD system according to an embodiment described herein.

FIG. 4 illustrates a schematic diagram of a combinatorial PVD system according to an embodiment described herein. Details of the combinatorial PVD system are described in U.S. patent application Ser. No. 12/027,980 filed on Feb. 7, 2008 and claiming priority to Sep. 5, 2007 and U.S. patent application Ser. No. 12/028,643 filed on Feb. 8, 2008 and claiming priority to Sep. 5, 2007.Substrate, 400, is held on substrate support, 402. Substrate support, 402, has two axes of rotation, 404 and 406. The two axes of rotation are not aligned. This feature allows different regions of the substrate to be accessed for processing. The substrate support may be moved in a vertical direction to alter the spacing between the PVD targets and the substrate. The combinatorial PVD system comprises multiple PVD assemblies configured within a PVD chamber (not shown). In FIG. 4, three PVD assemblies are shown, 408a-408c. Those skilled in the art will appreciate that any number of PVD assemblies may be used, limited only by the size of the chamber and the size of the PVD assemblies. Typically, four PVD assemblies are contained within the chamber. Advantageously, the multiple PVD assemblies contain different target materials to allow a wide range of material and alloys compositions to be investigated. Additionally, the combinatorial PVD system will typically include the capability for reactive sputtering in reactive gases such as O$_2$, NH$_3$, N$_2$, etc. The PVD assemblies may be moved in a vertical direction to alter the spacing between the PVD targets and the substrate and may be tilted to alter the angle of incidence of the sputtered material arriving at the substrate surface. The combinatorial PVD system further comprises a process kit shield assembly, 410. The process kit shield assembly includes an aperture, 412, used to define isolated regions on the surface. The portion of the process kit shield assembly that includes the aperture may have both rotational and translational capabilities. The combination of the substrate support movement, PVD assembly movement, and process kit shield assembly aperture movement allows multiple regions of the substrate to be processed in a site isolated manner wherein each site can be processed without interference from adjacent regions. Advantageously, the process parameters among the multiple site isolated regions can be varied in a combinatorial manner.

Figure 5:
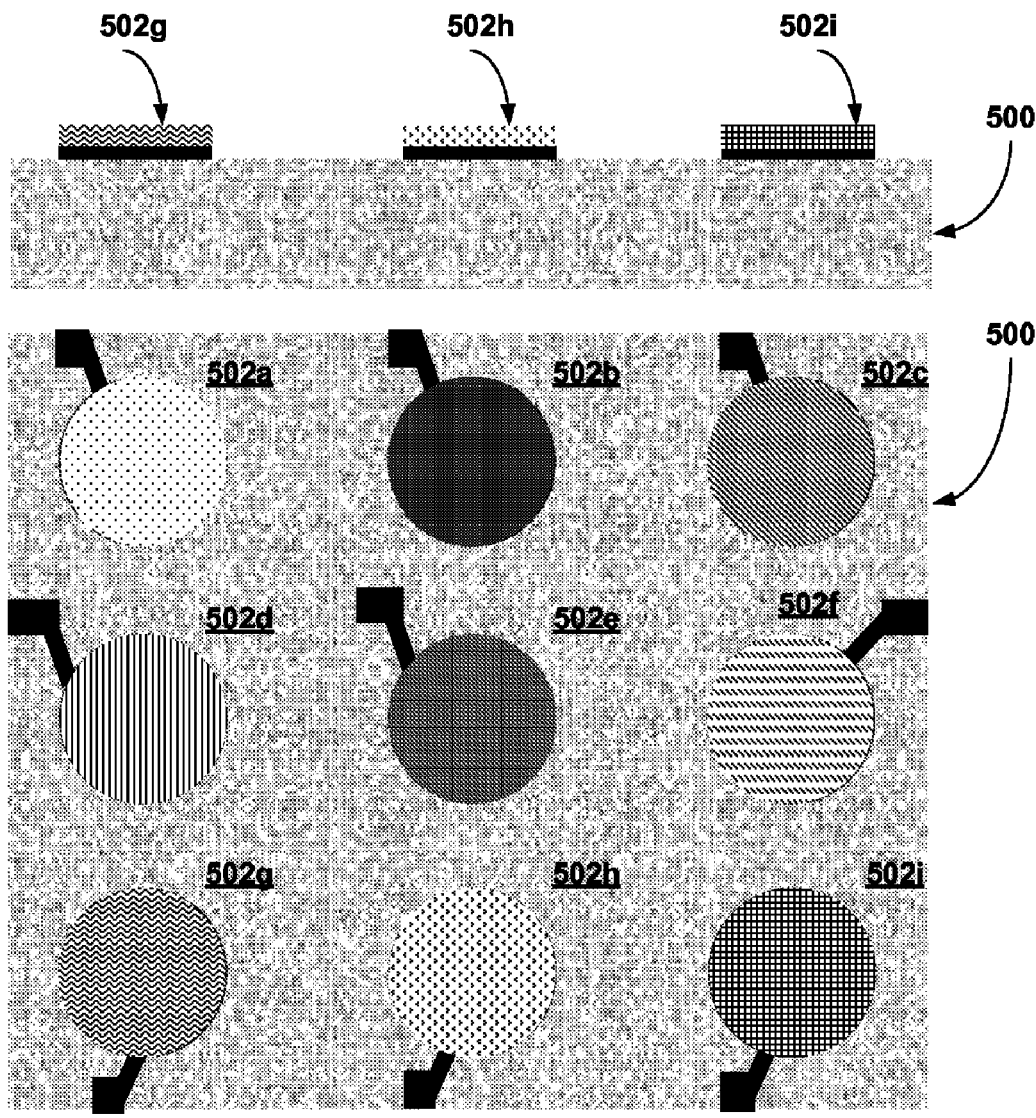
FIG. 5 illustrates a schematic diagram of a substrate that has been processed in a combinatorial manner.

FIG. 5 illustrates a schematic diagram of a substrate that has been processed in a combinatorial manner. Although the substrate in FIG. 5 is illustrated as being a generally square shape, those skilled in the art will understand that the substrate may be any useful shape such as round, rectangular, etc. FIG. 5 illustrates a substrate, 500, with nine site isolated regions, 502a-502i, illustrated thereon. The lower portion of FIG. 5 illustrates a top down view while the upper portion of FIG. 5 illustrates a cross-sectional view taken through the three site isolated regions, 502g-502i. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 2.

FIGS. 6A-6C illustrate a simple CIGS TFPV material stack consistent with some embodiments of the present invention. The convention will be used wherein light is assumed to be incident upon the top of the material stack. FIG. 6A illustrates the basic TFPV stack as described in the discussion of FIGS. 3A and 3B. Referring to FIG. 6B, a back contact layer, 604, (typically Mo) is formed above a substrate, 602, (typically soda lime glass (SLG)). The back contact layer is typically between about 0.2 um and 1.0 um in thickness. The back contact layer is typically formed using a physical vapor deposition (PVD) process but may also be formed using an evaporation process. A CIG(N) absorber layer, 606, is formed above the back contact layer. The absorber layer is typically between about 0.5 um and 3.0 um in thickness. The absorber layer may be formed using a variety of techniques such as PVD, co-evaporation, printing or spraying of inks, CVD, etc. The different shading of the absorber layer, 606, in FIG. 6B is an indication that development activities on this layer can be accomplished using HPC techniques as discussed previously.

In some embodiments of the present invention, a nitrogen containing gas such as N$_2$ or NH$_3$ is used during the PVD deposition of the Cu—In—Ga material. Thus, the CIG layer(s) is infused with nitrogen to form a CIGN absorber layer. The performance of the CIGN absorber layer will depend upon composition, structure, grain size, grain orientation, surface roughness, etc. These parameters can be affected by varying deposition conditions such as PVD source power, pressure, nitrogen containing gas flow, PVD source to substrate distance, substrate temperature, etc. The composition and deposition conditions can be varied in a combinatorial manner to develop CIGN absorber films with increased performance. One of the benefits of developing a high performance CIGN absorber film is that it eliminates the need for the selenization step as indicated in FIG. 6B. This benefit lowers the cost of the TFPV solar panel manufactured using CIGN and reduces the toxicity and hazards of the manufacturing process. The substrate/back contact/absorber stack portion of the final TFPV solar panel is indicated in FIG. 6C wherein there is no Se component.

FIGS. 7A-7C illustrate a simple CIGS TFPV material stack consistent with some embodiments of the present invention. The convention will be used wherein light is assumed to be incident upon the top of the material stack. FIG. 7A illustrates the basic TFPV stack as described in the discussion of FIGS. 3A and 3B. Referring to FIG. 7B, a back contact layer, 704, (typically Mo) is formed above a substrate, 702, (typically soda lime glass (SLG)). The back contact layer is typically between about 0.2 um and 1.0 um in thickness. The back contact layer is typically formed using a physical vapor deposition (PVD) process but may also be formed using an evaporation process. A CIG absorber layer, 706, is formed above the back contact layer. The absorber layer is typically between about 0.5 um and 3.0 um in thickness. The absorber layer may be formed using a variety of techniques such as PVD, co-evaporation, printing or spraying of inks, CVD, etc. The different shading of the absorber layer, 706, in FIG. 7B is an indication that development activities on this layer can be accomplished using HPC techniques as discussed previously.

As mentioned previously, the CIG layers are sensitive to exposure to oxygen or water vapor between the end of the deposition step and the selenization step. In some embodiments of the present invention, a nitrogen containing gas such as N$_2$ or NH$_3$ is used at the end of the PVD deposition of the Cu—In—Ga material to form a protective CIGN layer, 716. Thus, the surface of the CIG layer(s) is infused with nitrogen to form a CIGN layer at the surface. Therefore, the CIGN layer will protect the underlying CIG layers from degradation due to oxygen or water vapor exposure while the substrate is waiting for the selenization step. The thickness of the CIGN protective layer is about 10 nm. The performance of the CIGN protective layer will depend upon composition, structure, grain size, grain orientation, surface roughness, etc. These parameters can be affected by varying deposition conditions such as PVD source power, pressure, nitrogen containing gas flow, PVD source to substrate distance, substrate temperature, etc. The deposition conditions can be varied in a combinatorial manner to develop CIGN protective layers with increased performance. The substrate/back contact/absorber stack portion of the final TFPV solar panel is indicated in FIG. 7C.

FIGS. 8A-8C illustrate a simple CIGS TFPV material stack consistent with some embodiments of the present invention. The convention will be used wherein light is assumed to be incident upon the top of the material stack. FIG. 8A illustrates the basic TFPV stack as described in the discussion of FIGS. 3A and 3B. Referring to FIG. 8B, a back contact layer, 804, (typically Mo) is formed above a substrate, 802, (typically soda lime glass (SLG)). The back contact layer is typically between about 0.2 um and 1.0 um in thickness. The back contact layer is typically formed using a physical vapor deposition (PVD) process but may also be formed using an evaporation process. A CIGN layer, 816, is deposited above the back contact prior to the deposition of the non-nitrided CIG absorber layer. A CIG absorber layer, 806, is formed above the CIGN layer. The absorber layer is typically between about 0.5 um and 3.0 um in thickness. The absorber layer may be formed using a variety of techniques such as PVD, co-evaporation, printing or spraying of inks, CVD, etc. The different shading of the absorber layer, 806, in FIG. 8B is an indication that development activities on this layer can be accomplished using HPC techniques as discussed previously.

It is desirable for the CIG layers to have good adhesion to the back contact layer. The adhesion at this interface can be improved by depositing a thin layer of CIGN between the back contact layer and the bulk of the CIG absorber layer. In some embodiments of the present invention, a nitrogen containing gas such as $N_2$ or $NH_3$ is used at the beginning of the PVD deposition of the Cu—In—Ga material to form a CIGN adhesion layer, 816. Thus, the surface of the CIG layer(s) is infused with nitrogen to form a CIGN layer at the initial interface. The flow of the nitrogen containing gas would then be stopped and the remaining portion of the CIG absorber layer deposited without nitrogen. The thickness of the CIGN adhesion layer is about 10 nm. The performance of the CIGN adhesion layer will depend upon composition, structure, grain size, grain orientation, surface roughness, etc. These parameters can be affected by varying deposition conditions such as PVD source power, pressure, nitrogen containing gas flow, PVD source to substrate distance, substrate temperature, etc. The deposition conditions can be varied in a combinatorial manner to develop CIGN adhesion layers with increased performance. The substrate/back contact/absorber stack portion of the final TFPV solar panel is indicated in FIG. 8C.

FIGS. 9A-9C illustrate a simple CIGS TFPV material stack consistent with some embodiments of the present invention. The convention will be used wherein light is assumed to be incident upon the top of the material stack. FIG. 9A illustrates the basic TFPV stack as described in the discussion of FIGS. 3A and 3B. Referring to FIG. 9B, a back contact layer, 904, (typically Mo) is formed above a substrate, 902, (typically soda lime glass (SLG)). The back contact layer is typically between about 0.2 um and 1.0 um in thickness. The back contact layer is typically formed using a physical vapor deposition (PVD) process but may also be formed using an evaporation process. A CIGN adhesion layer, 916, is deposited above the back contact prior to the deposition of the non-nitrided CIG absorber layer as discussed with respect to FIGS. 8A-8C. A CIG absorber layer, 906, is formed above the CIGN layer. The absorber layer is typically between about 0.5 um and 3.0 um in thickness. The absorber layer may be formed using a variety of techniques such as PVD, co-evaporation, printing or spraying of inks, CVD, etc. The different shading of the absorber layer, 906, in FIG. 9B is an indication that development activities on this layer can be accomplished using HPC techniques as discussed previously.

As mentioned previously, the CIG layers are sensitive to exposure to oxygen or water vapor between the end of the deposition step and the selenization step. In some embodiments of the present invention, a nitrogen containing gas such as $N_2$ or $NH_3$ is used at the end of the PVD deposition of the Cu—In—Ga material to form a protective CIGN layer, 918 as discussed with respect to FIGS. 7A-7C. Thus, the surface of the CIG layer(s) is infused with nitrogen to form a CIGN layer at the surface. Therefore, the CIGN layer will protect the underlying CIG layers from degradation due to oxygen or water vapor exposure while the substrate is waiting for the selenization step. The thickness of the CIGN protective layer is about 10 nm.

The performance of the CIGN adhesion layer and the CIGN protective layer will depend upon composition, structure, grain size, grain orientation, surface roughness, etc. These parameters can be affected by varying deposition conditions such as PVD source power, pressure, nitrogen containing gas flow, PVD source to substrate distance, substrate temperature, etc. The deposition conditions can be varied in a combinatorial manner to develop CIGN adhesion layers with increased performance. The deposition conditions may be different for the two different types of CIGN layers. The substrate/back contact/absorber stack portion of the final TFPV solar panel is indicated in FIG. 9C.

Figure 10A:
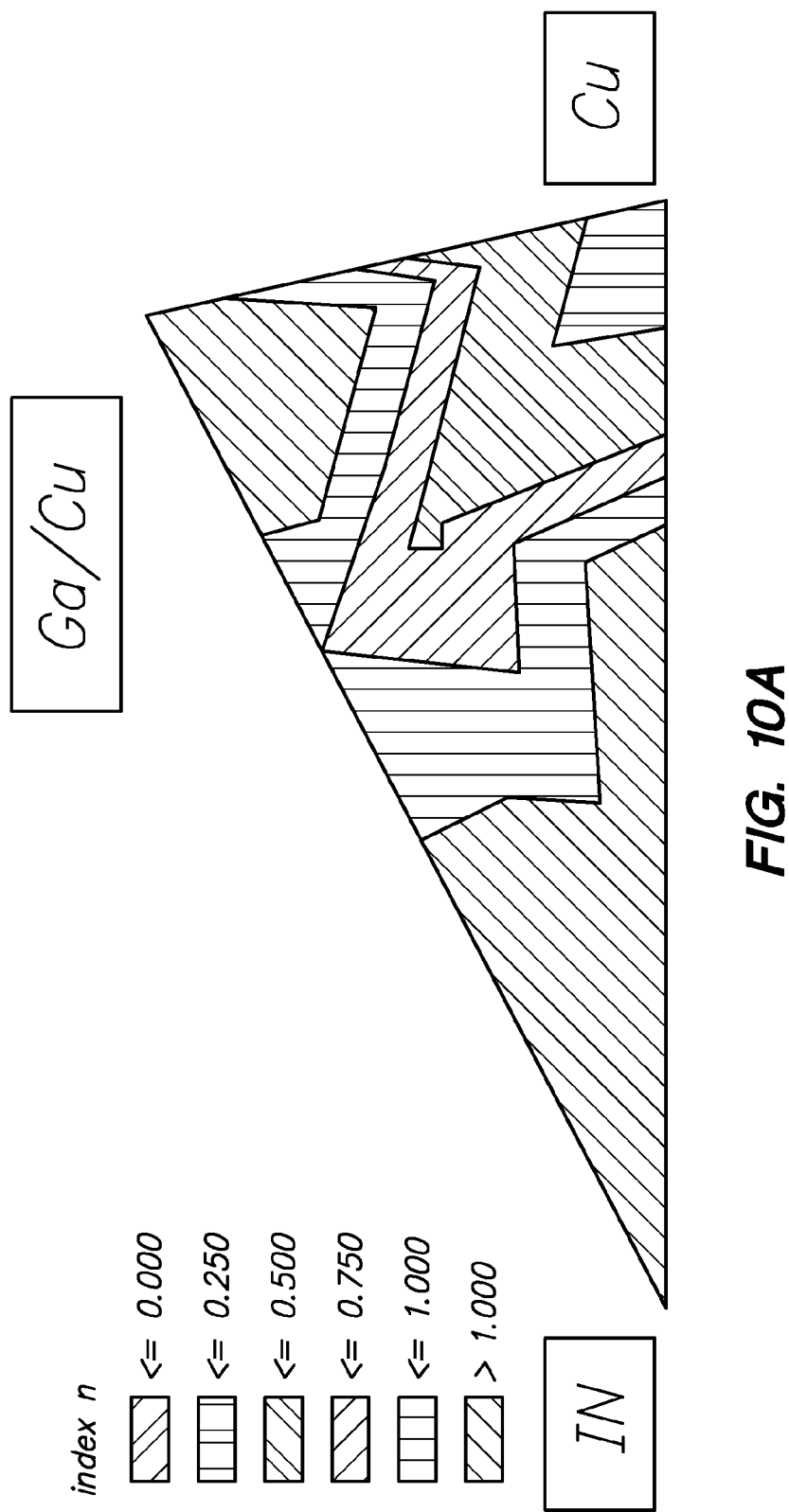

FIGS. 10A-10B present data for the refractive index, n, and extinction coefficient, k, for Cu—In—Ga films at 633 nm. FIG. 10A presents data for the refractive index, n, of a range of $Cu_x$—In—$Ga_y$ ternary alloys measured at 633 nm. The refractive index for the pure metallic system is low and ranges from about 0 to about 1. FIG. 10B presents data for the extinction coefficient, k, of a range of $Cu_x$—In—$Ga_y$ ternary alloys measured at 633 nm. The extinction coefficient for the pure metallic system is high and ranges from about 3 to about 6. The samples may be formed by varying composition, pressure, power, target to substrate spacing, etc. These process parameters may be varied in a combinatorial manner as discussed previously.

Figure 11A:
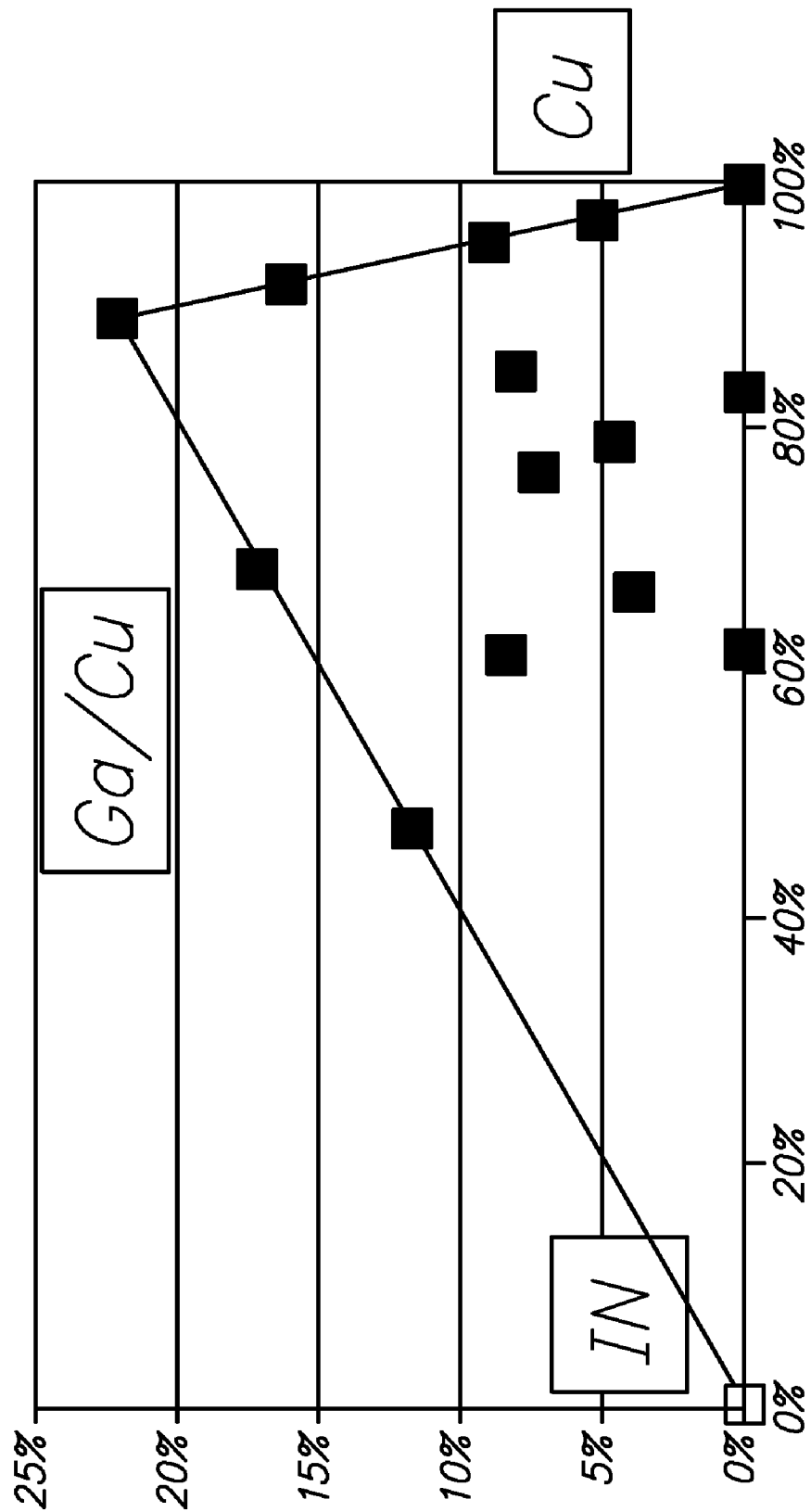
FIGS. 11A-11D present data for the band gap, refractive index, n, and extinction coefficient, k, for Cu—In—Ga—N films at 633 nm.
Figure 11B:
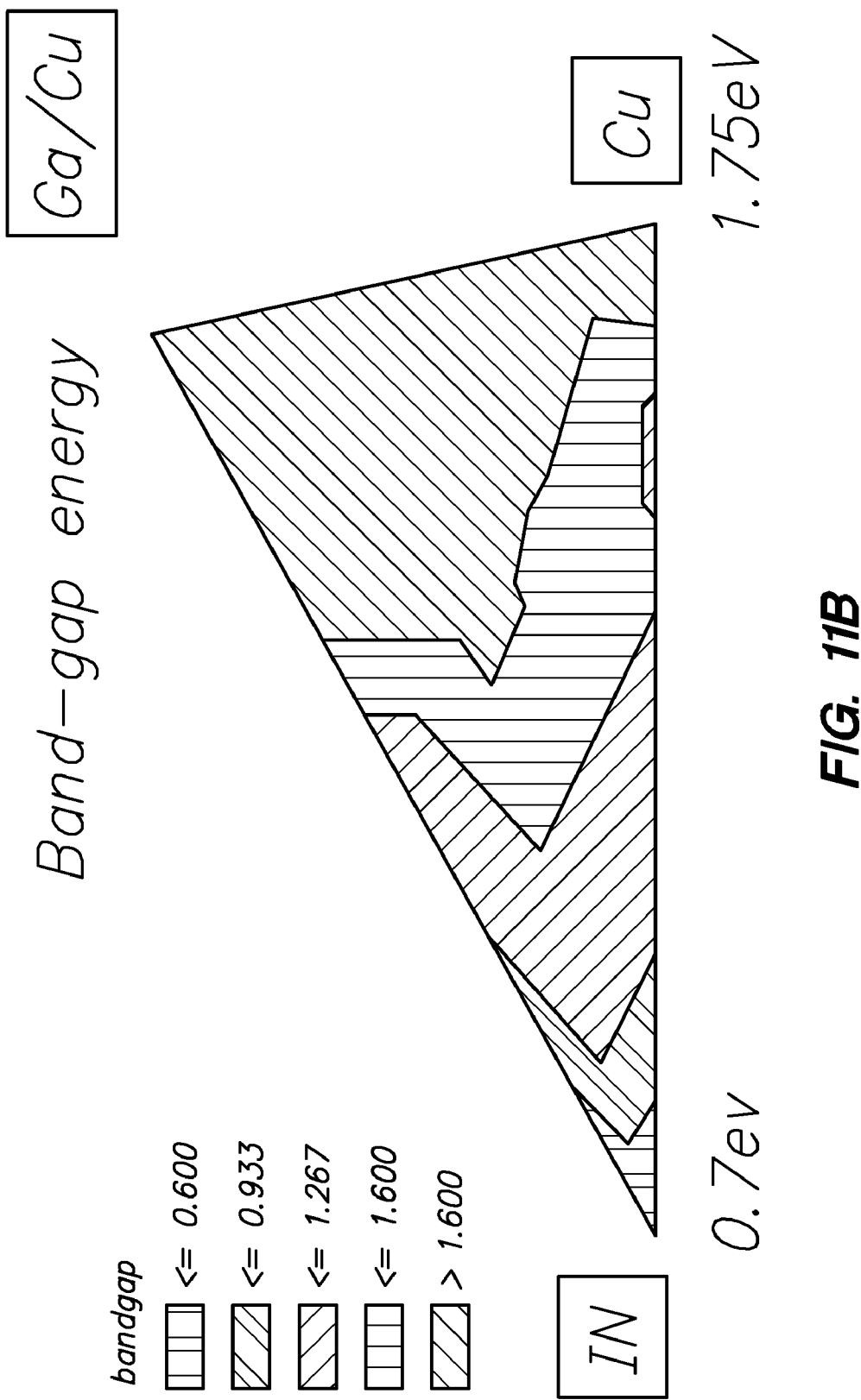
Figure 11C:
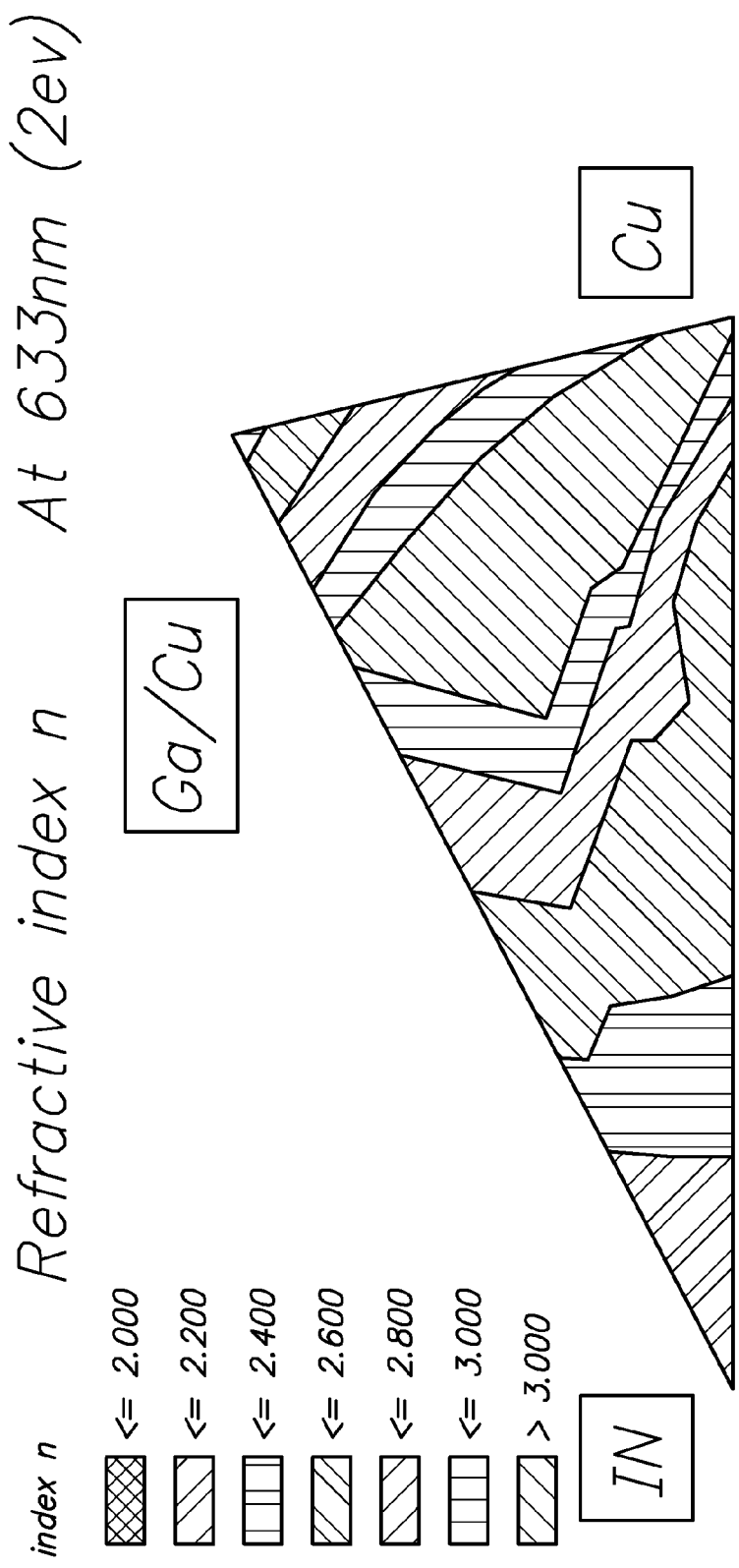
Figure 11D:
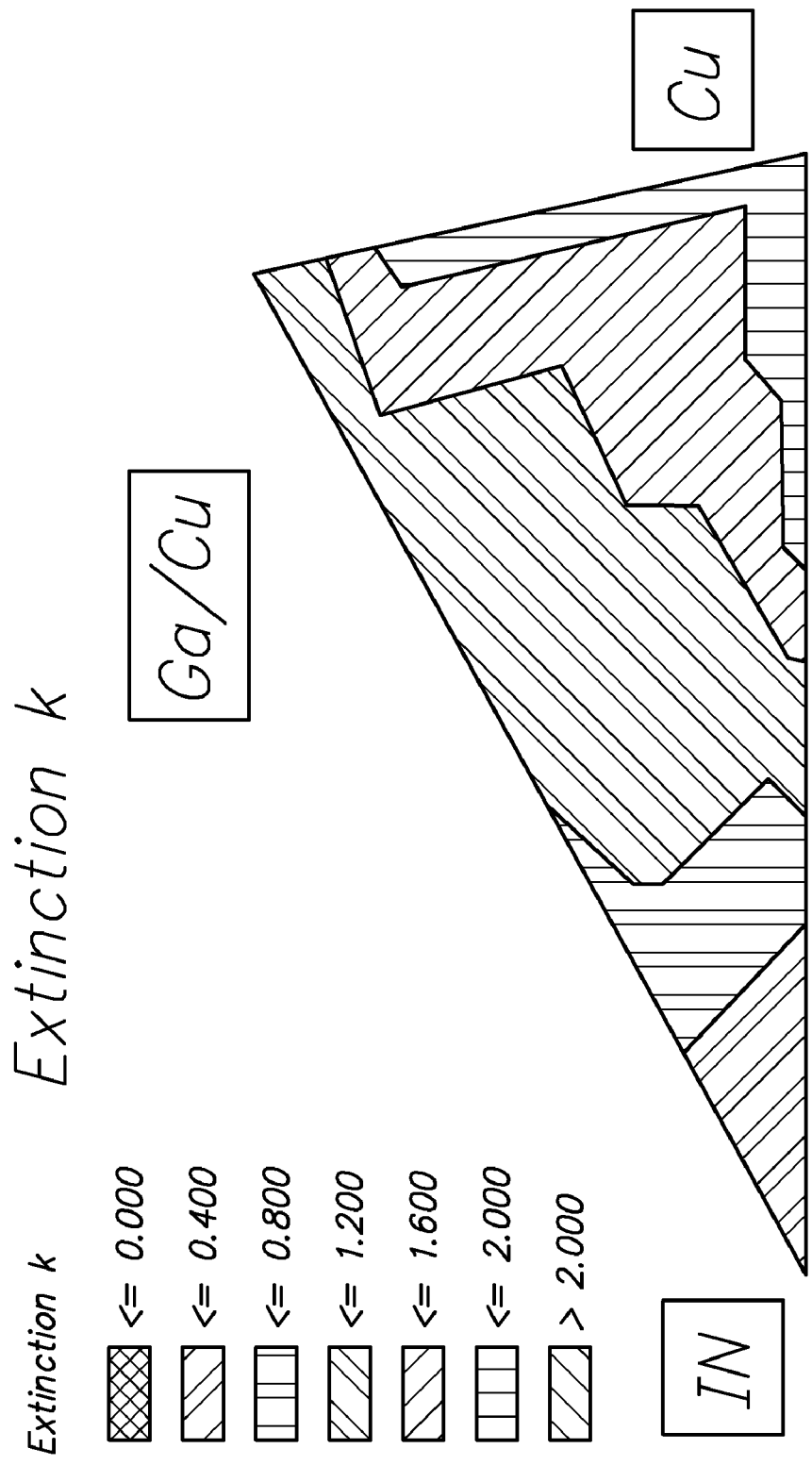

FIGS. 11A-11D presents data for the band gap, refractive index, n, and extinction coefficient, k, for $Cu_x$—In—$Ga_y$—N films at 633 nm. FIG. 11A illustrates the range of compositions used to generate the data presented in FIGS. 11B-11D. FIG. 11B indicates that the band gap is dependent on the composition, x,y, and varies between about 0.6 eV and about 1.6 eV. FIG. 11C indicates the refractive index for the nitrided system is higher than that for the metallic system and ranges from about 2 to about 3. FIG. 11D indicates the extinction coefficient for the nitrided system is lower than that for the metallic system and ranges from about 0 to about 2. The samples may be formed by varying composition, Ar/N-species ratio, pressure, power, target to substrate spacing, etc. These process parameters may be varied in a combinatorial manner as discussed previously.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a thin film photovoltaic device comprising:
    forming a back contact material above a substrate;
    depositing Cu, In and Ga by PVD in a nitrogen containing atmosphere to form a Cu—In—Ga—N absorber layer above the back contact layer;
    forming a buffer layer above the absorber layer; and
    forming a TCO stack above the buffer layer.

2. The method of claim 1 wherein the absorber layer is further subjected to a selenization step after the forming.

3. The method of claim 1 wherein the Cu—In—Ga—N absorber layer has a refractive index between about 2 and about 3 when measured at 633 nm.

4. The method of claim 1 wherein the Cu—In—Ga—N absorber layer has an extinction coefficient between about 0 and about 2 when measured at 633 nm.

5. The method of claim 1 wherein the Cu—In—Ga—N absorber layer has a band gap between about 0.6 eV and about 1.6 eV.

6. The method of claim 1 wherein the nitrogen containing atmosphere is $N_2$ or $NH_3$.

* * * * *